(12) United States Patent
Park et al.

(10) Patent No.: US 7,858,473 B2
(45) Date of Patent: Dec. 28, 2010

(54) FLASH MEMORY DEVICE AND METHOD OF MANUFACTURING THE SAME

(75) Inventors: Jin-Ha Park, Gyeonggi-do (KR); Jae-Hee Kim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 329 days.

(21) Appl. No.: 11/932,273

(22) Filed: Oct. 31, 2007

(65) Prior Publication Data

US 2008/0128785 A1 Jun. 5, 2008

(30) Foreign Application Priority Data

Nov. 30, 2006 (KR) .................. 10-2006-0120171

(51) Int. Cl.
*H01L 21/336* (2006.01)
*H01L 29/788* (2006.01)

(52) U.S. Cl. ...................................... 438/262; 257/318

(58) Field of Classification Search ................. 438/230, 438/262; 257/316–321, E29.135–E29.14
See application file for complete search history.

(56) References Cited

U.S. PATENT DOCUMENTS

| 5,436,489 | A | * | 7/1995 | Murase | ...................... 257/401 |
| 2002/0192915 | A1 | | 12/2002 | Wada et al. | |
| 2005/0048754 | A1 | | 3/2005 | Yeh et al. | |
| 2006/0163678 | A1 | * | 7/2006 | Anezaki | ..................... 257/411 |

FOREIGN PATENT DOCUMENTS

CN 1591823 3/2005

* cited by examiner

*Primary Examiner*—Calvin Lee
(74) *Attorney, Agent, or Firm*—Sherr & Vaughn, PLLC

(57) ABSTRACT

A flash memory device having a spacer of a gate region formed in an oxide-nitride-oxide (ONO) structure and a source/drain region formed using the ONO structure. The outermost oxide in the ONO structure is removed and an interlayer insulating film is formed to ensure sufficient space between the gate regions. Thus, it is possible to prevent a void from being generated in the interlayer insulating film and prevent a word line from being electrically connected to a drain contact for forming a bit line.

9 Claims, 5 Drawing Sheets

FLASH MEMORY DEVICE AND METHOD OF MANUFACTURING THE SAME

The present application claims priority under 35 U.S.C. 119 to Korean Patent Application No. 10-2006-0120171 (filed on Nov. 30, 2006), which is hereby incorporated by reference in its entirety.

BACKGROUND

Semiconductor memory devices may be categorized as read only memory (ROM) devices or volatile RAM devices such as dynamic random access memory (DRAM) and static random access memory (SRAM). ROM devices can maintain data over time, but have low I/O data rates. RAM devices have high I/O data rates, but gradually lose data over time.

Non-volatile memory devices have an almost unlimited accumulation capacity. There has been increasing demand for flash memory devices such an electrically erasable and programmable ROM having I/O data capabilities. Flash memory is a non-volatile memory medium without damage on the stored data even though power is off. Flash memory has an advantage such as relatively high writing, reading and erasing processing speed. Accordingly, flash memory may be used for PC bias or for storing data in a set-top box, a printer, a network server and also for digital cameras and mobile phones.

Flash memory devices may be categorized as NAND type devices or NOR type devices. NAND flash memory devices may include cell transistors that may be connected in series to form a unit string. The unit strings may be connected in parallel between a bit line and a ground line, thereby allowing high integration. NOR flash memory devices may include cell transistors that may be connected in parallel between a bit line and a ground line, thereby allowing high-speed operation.

Figure 1:
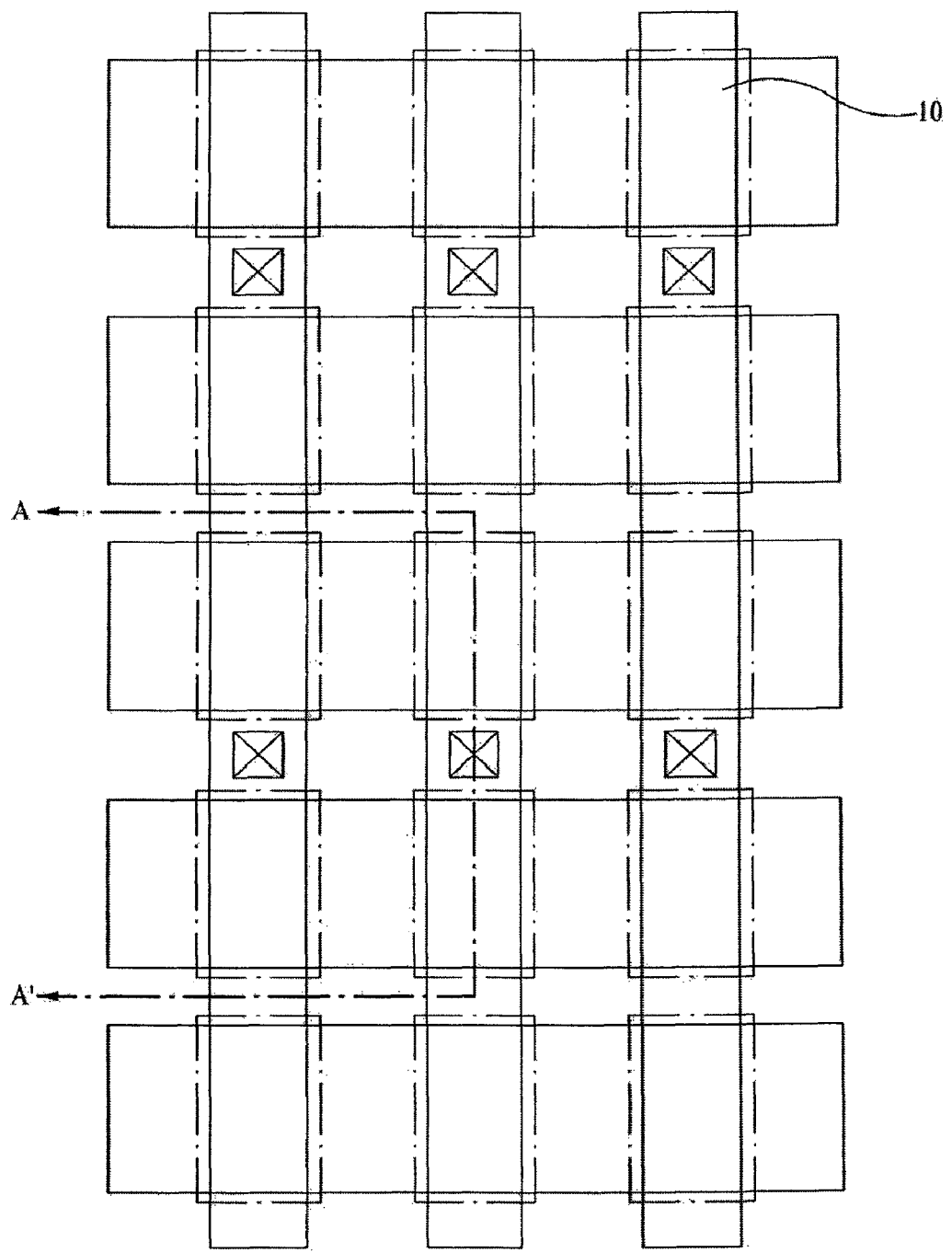

As illustrated in example FIG. 1, the structure of a cell array may include an active region in which a channel is formed to generate hot electrons, a floating gate for storing injected hot electrons and a drain contact. According to the structure of the cell array, two gate regions may share one drain contact in a unit cell.

Figure 2:
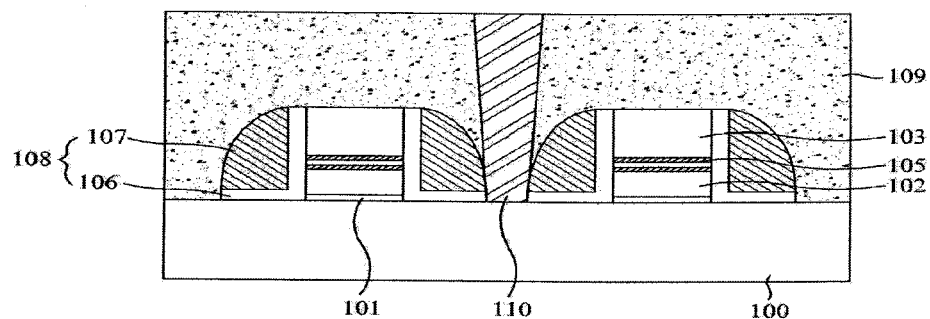

Example FIG. 2 illustrates a cross-sectional view of the unit cell of example FIG. 1 taken along a line A-A'. The unit cell may include tunnel oxide film 101 formed on and/or over semiconductor substrate 100. Floating gate 102 for storing data may be formed on and/or over tunnel oxide film 101. Dielectric film 105 may be formed on and/or over floating gate 102. Control gate 103 serving as a word line, may be formed on and/or over dielectric film 105. Thus, dielectric film 105 separates floating gate and control gate 103. A pair of spacers 108 having an oxide-nitride (ON) structure may be formed by sequentially coating and etching oxide film 106 and nitride film 107 to separate and protect the gate region. The unit cell may further include a source/drain region formed by ion implantation using spacer 108 as a mask. Interlayer insulating film 109 may be formed on and/or over control gate 103 and spacer 108 using a boron phosphorus silicate glass (BPSG) film or an insulating material such as HDP-USG. Drain contact 110 serving as a bit line contact may be formed to pass through interlayer insulating film 109. Control gate 103 serves as a word line and drain contact 110 serves as a bit line in programming, erasing and reading the unit cell.

Figure 3:
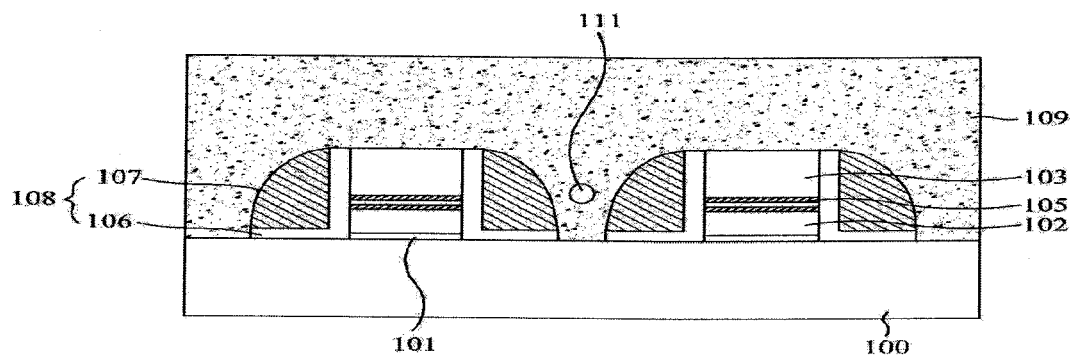

As illustrated in example FIG. 3, the unit cell may have sufficient space for forming a contact in a flash memory device of the order of 0.13 um, which is a main type of the NOR type flash memory device. However, as the size of the unit cell is smaller, a distance between the gate regions forming the unit cells may be reduced, thereby generating void 111 after a deposition process for forming interlayer insulating film 109. Void 111 may change the characteristics of the respective cells. When void 111 is generated, there is a problem that the word lines may operate differently. If a metal material such as tungsten (W) is filled after formation of drain contact 110, the tungsten may be diffused into void 111. This may in turn generate a contact bridge phenomenon in which tungsten forms a bridge by another contact. Accordingly, the gate formed in the word line may not operate properly and thus generates an operation error, thereby causing defects in the cell operation.

SUMMARY

Embodiments relate to a flash memory device and a method of manufacturing the same in which a spacer of a gate region can be formed in an oxide-nitride-oxide (ONO) structure instead of a oxide-nitride (ON) structure. Moreover, a source/drain region can be formed using the spacer, and the outermost oxide layer in the ONO structure can be removed, thereby prevent generation of a void by ensuring sufficient space for forming an interlayer insulating film and a drain contact.

Embodiments relate to a method of manufacturing a flash memory device that can include at least one of the following steps: forming a gate region including a tunnel oxide film, a floating gate, a dielectric film and a control gate over a semiconductor substrate; forming a spacer film having a multi-layer insulating film structure against a sidewall of the gate region; forming a spacer pattern by performing an entire surface etching on the spacer film; removing an insulating film disposed at an outermost position of the spacer pattern; and then forming an interlayer insulating film over the semiconductor substrate with the gate region and a spacer formed thereon.

Embodiments relate to a flash memory device that can include a semiconductor substrate; a gate region including a tunnel oxide film, a floating gate, a dielectric film and a control gate formed over the semiconductor substrate; a spacer film including an lower spacer film and an upper spacer film formed on a sidewall of the gate region; and an interlayer insulating film formed over the gate region and the spacer.

DRAWINGS

Example FIGS. 1 to 3 illustrate a cell array of a flash memory device.

Example FIGS. 4 to 8 illustrate a flash memory device, in accordance with embodiments.

DESCRIPTION

When it is described that a certain film is disposed "on" another film or a semiconductor substrate, the certain film may be in direct contact with the other film or the semiconductor substrate or a third film may be interposed therebetween. Further, the thickness and size of the respective layers in the drawings are exaggerated for convenience and clearness of explanation.

Figure 4:
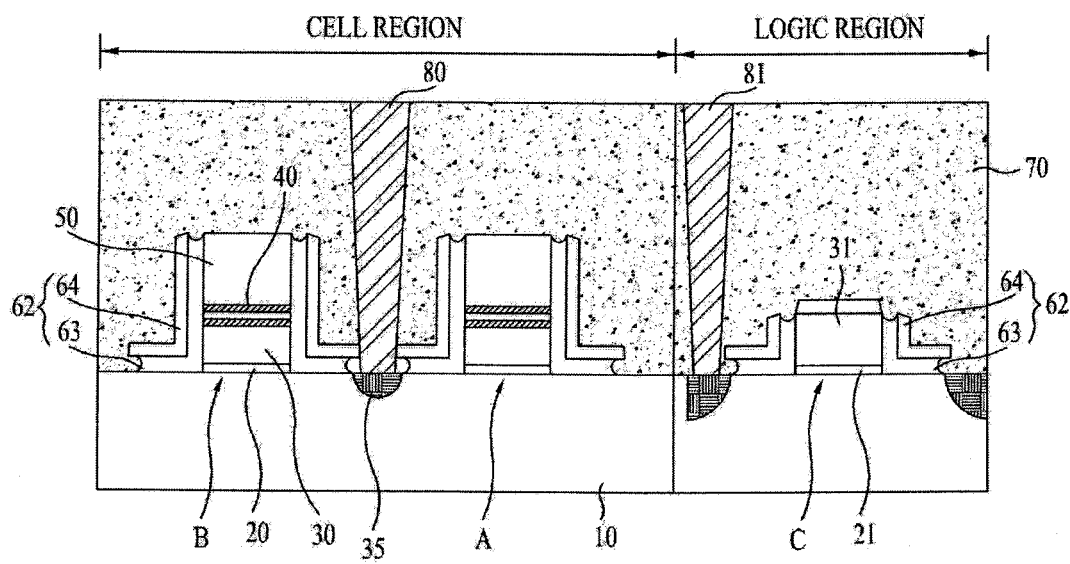

As illustrated in example FIG. 4, semiconductor substrate 10 can be divided into a logic region and a cell or SONOS region. The logic region can include a logic PMOS region and a logic NMOS region. The thickness of a gate oxide film formed in the logic region may vary according to a low-voltage region, a high-voltage region and an ultrahigh-voltage region.

In accordance with embodiments, a flash memory device may include a plurality of gate patterns A, B and C formed in the cell region and the logic region, respectively. A unit cell has a structure in which two gate regions A and B can share drain contact 80. The contact in the logic region is assigned for gate region C. The same reference numerals are used for the same configurations in the gate regions A, B and C. Semiconductor substrate 10 can include a device isolation film, a well and a channel.

Gate region A or B of the cell region can include tunnel oxide film 20 formed on and/or over semiconductor substrate 10. Floating gate 30 for storing data can be formed on and/or over semiconductor substrate 10 including tunnel oxide film 20. Gate control 50 can serve as a word line, and dielectric film 40 can be formed between floating gate 30 and control gate 50 to separate them from each other. Dielectric film 40 can have a multi-layer structure such as an oxide-nitride-oxide (ONO) structure.

Gate region C of the logic region can include gate oxide film 21 formed on and/or over semiconductor substrate 10 and polysilicon gate 31 formed on and/or over gate oxide film 21. A lightly doped drain (LDD) region, which can serve as a low concentration impurity region, may be disposed between gate regions A and B of the cell region. The unit cell can include spacer 62 for separating and protecting gate regions A and B. Spacer 62 can have a multi-layer stacked structure including lower spacer film 63 and upper spacer film 64. Lower spacer film 63 may be composed of an oxide-based material and upper spacer film layer 64 may be composed of a nitride-based material.

Interlayer insulating film 70 can be formed on and/or over gate regions A, B and C. The flash memory device in accordance with embodiments has sufficient space between gate regions A and B. Accordingly, a void is not generated when interlayer insulating film 70 is formed. Thereafter, a contact hole can be formed on and/or over a side portion of gate region C and also between gate regions A and B. A metal material such as tungsten (W) can be filled in the contact hole to form drain contact 80 and contact 81.

Figure 5:
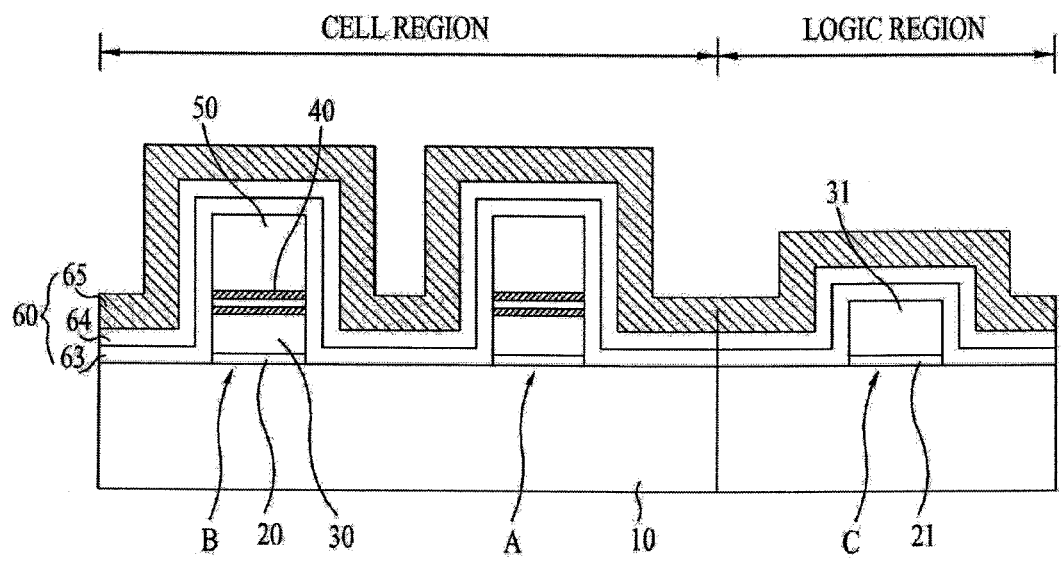
Figure 6:
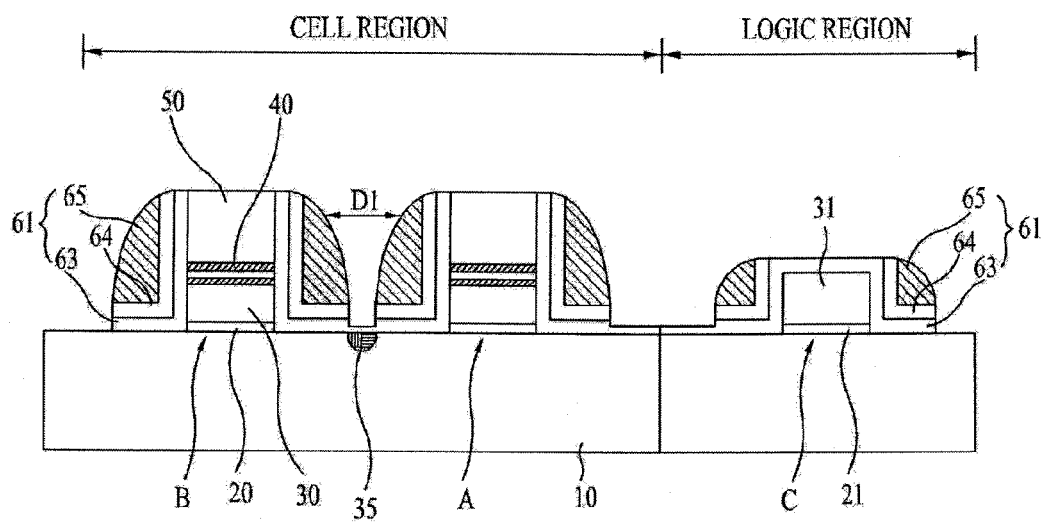

As illustrated in example FIG. 5, a plurality of gate patterns A, B and C can be formed in the cell region and the logic region of semiconductor substrate 10, respectively. Tunnel oxide film 20 for storing data, floating gate 30, dielectric film 40 and control gate 50 can be sequentially stacked and patterned on and/or over semiconductor substrate 10 to form gate regions A and B. Gate region C of the logic region can be formed by sequentially stacking and patterning gate oxide film 21 and polysilicon gate 31 on and/or over semiconductor substrate 10.

After formation of gate regions A, B and C, an LDD can be formed between the gate regions on and/or over semiconductor substrate 10 using ion implantation of low concentration impurities through an ion implantation process and gate regions A and B as masks.

A spacer film having a multi-layer insulating film structure can be formed on and/or over a sidewall of gate regions A, B and C. The multi-layer insulating film structure can be formed by sequentially depositing first oxide film 63, nitride film 64 and second oxide film 65 on and/or over the entire unit cell. First oxide film 63 may be composed of tetraethyl orthosilicate (TEOS) at a thickness between approximately 150 to 300 Å. Nitride film 64 may be composed of SiN at a thickness between approximately 100 to 300 Å. Second oxide film 65 may be composed of TEOS at a thickness between approximately 500 to 800 Å.

As illustrated in example FIG. 6A, after formation of spacer film 60 of a triple insulating film structure is formed, spacer film 60 can be etched using an entire surface etching method to form spacer pattern 61 at opposite sides of gate regions A, B and C. First gap region D1 can be formed as an empty space to expose an uppermost surface of semiconductor substrate 10 between gate regions A and B. Spacer pattern 61 may be formed having a substantially spherical shape using reactive ion etching. The outermost ends of first oxide film 63, nitride film 64 and second oxide film 65 may be exposed using an etching process. Nitride film 64 can be used as an etching stop film such that an etching process can be stopped at nitride film 64.

An ion implantation process can be performed using spacer pattern 61 and gate regions A, B and C as ion implantation masks to form source/drain region 35 having a high concentration impurity region on and/or over semiconductor substrate 10. Source/drain region 35 can have conductivity as ions are implanted therein using an ion implantation process.

Figure 7:
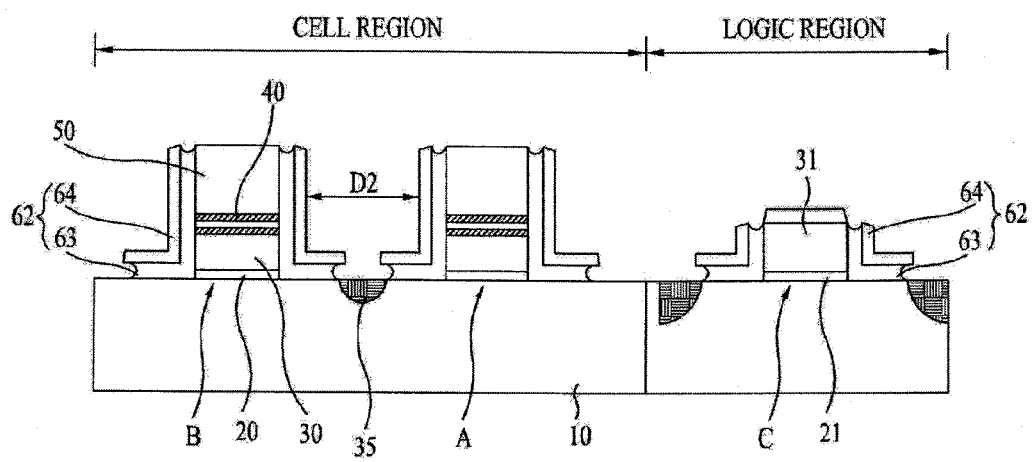

As illustrated in example FIG. 7, first gap region D1 can be narrowly formed adjacent spacer pattern 61. A void may be generated when interlayer insulating film 70 is subsequently formed. However, in order to prevent generation of the void, second oxide film 65 disposed at an outermost position of spacer pattern 61 can be removed. Second oxide film 65 may be etched using a wet etching method.

Second oxide film 65 may be removed by etching second oxide film 65 using a buffered HF (BHF) solution. Second oxide film 65 may be removed by soaking semiconductor substrate 10 in an etching solution such as hydrogen fluoride (HF). A mixing ratio of hydrogen fluoride (HF) and water ($H_2O$) may be in a range between approximately 1:100 to 1:200. The processing time can be in a range of between approximately 100 to 140 seconds. When second oxide film 65 is etched, an outer portion of first oxide film 63 which is the same material as the second oxide film 65 can also be etched, thereby forming spacer 62 and second gap region D2. Nitride film 64 can be used as an etching stop film in the etching process for removing second oxide film 65. Even though a profile of spacer pattern 61 is changed into spacer 62, there is no effect on the operation of the flash memory device. As a result, since second oxide film 65 is removed, spacer 62 including first oxide film 63 and nitride film 64 can be formed on and/or over gate regions A and B. Second gap region D2 having a large space can be formed between gate regions A and B.

Figure 8:
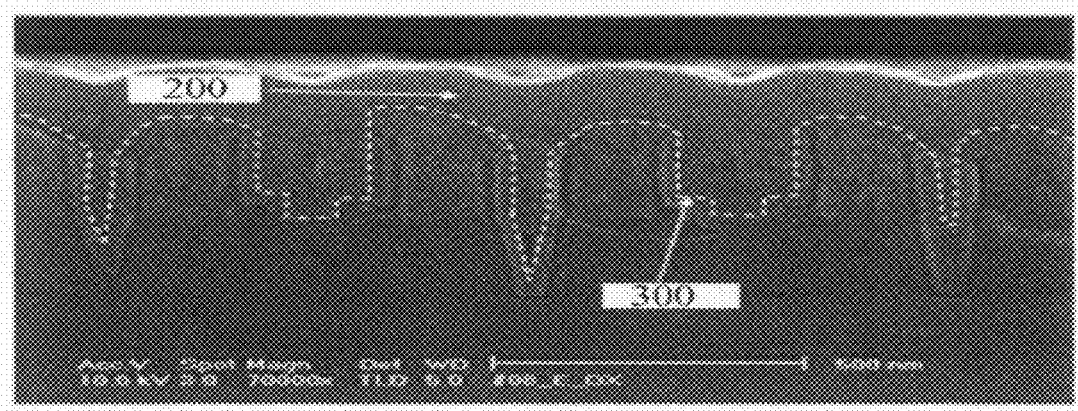

Example FIG. 8 illustrates a photograph obtained by a scanning electron microscope (SEM) after removal of second oxide film 65 in which poly is used as a capping layer.

As illustrated in example FIG. 8, after poly is deposited as capping layer 200, a photograph was taken using an SEM. It can be seen that the second oxide film is removed up to the nitride film. First gap region D1 between gate regions A and B is increased to the second gap region D2. Accordingly, it can be possible to sufficiently ensure a process margin in the following step for forming a drain contact. Moreover, it can be possible to reduce the distance between gate regions A and B to an amount substantially equal to the thickness of the removed second oxide film 65, thereby increasing the integration density of the flash memory device.

As illustrated in example FIG. 4, interlayer insulating film 70 can be formed on and/or over gate regions A, B and C. Interlayer insulating film 70 can be composed of a pre metal dielectric (PMD) such as at least one of phosphorus-doped silicate glass (PSG), boro-phosphorus silicate glass (BPSG) and plasma enhanced TEOS (PE-TEOS). Because second gap region D2 has a sufficient space, a void is not generated when interlayer insulating film 70 is formed.

After a contact hole is formed between gate regions A and B and in a side portion of gate region C, a metal material such as tungsten (W) can be formed in the contact hole, thereby forming drain contact 80 and contact 81. Since the void of is not generated in interlayer insulating film 70, a diffusion phenomenon is not generated during the deposition of tungsten. Accordingly, the flash memory device can perform a normal operation.

Although gate regions A and B and gate region C can be formed simultaneously, gate regions A and B may be formed separately from the formation of gate region C.

In accordance with embodiments, a flash memory device and a method of manufacturing the flash memory device may include a spacer of a gate region formed having an oxide-nitride-oxide (ONO) structure and a source/drain region formed using the ONO structure. The outermost oxide of the ONO structure can be removed to form an interlayer insulating film to provide sufficient space between the gate regions. Accordingly, formation of a void in the interlayer insulating film can be prevented, and thus, also prevents a word line from being electrically connected to a drain contact for forming a bit line. Meaning, a contact bridge phenomenon can be prevented, thereby ensuring reliability of the flash memory device and realizing high integration.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
   forming a gate region including a tunnel oxide film, a floating gate, a dielectric film and a control gate over a semiconductor substrate;
   forming a spacer film having a first oxide film, a nitride film, and a second oxide film against a sidewall of the gate region;
   forming a spacer pattern by performing an entire surface etching on the spacer film;
   forming a source/drain region by performing an ion implantation process using the spacer pattern and the gate region as a mask;
   removing the second oxide film disposed at an outermost position of the spacer pattern after forming the source/drain region; and then
   forming an interlayer insulating film over the semiconductor substrate with the gate region and a spacer formed thereon.

2. The method of claim 1, wherein the second oxide film disposed at the outermost position of the spacer pattern is removed using a wet etching method.

3. The method of claim 2, wherein a BHF solution is used as an etching solution in the wet etching method.

4. The method of claim 1, wherein the first oxide film comprises TEOS.

5. The method of claim 4, wherein the second oxide film comprises TEOS.

6. The method of claim 5, wherein the nitride film comprises SiN.

7. The method of claim 6, wherein the first oxide film has a thickness between approximately 150 to 300 Å.

8. The method of claim 7, wherein the nitride film has a thickness between approximately 100 to 300 Å.

9. The method of claim 8, wherein the second oxide film has a thickness between approximately 500 to 800 Å.

* * * * *